(12) United States Patent
Yang et al.

(10) Patent No.: US 6,326,320 B1
(45) Date of Patent: Dec. 4, 2001

(54) METHOD FOR FORMING OXIDE LAYER ON CONDUCTOR PLUG OF TRENCH STRUCTURE

(75) Inventors: Yi-Chuan Yang, Hsin-Chuang; Jason Chien-Song Chu, Taipei; Mike Wen-Jeh Su, Tainan, all of (TW)

(73) Assignee: Mosel Vitelic Inc. (TW)

( * ) Notice: Subject to any disclaimer, the term of this patent is extended or adjusted under 35 U.S.C. 154(b) by 0 days.

(21) Appl. No.: 09/655,042

(22) Filed: Sep. 5, 2000

(30) Foreign Application Priority Data

Jun. 29, 2000 (TW) .............................. 89112799 A

(51) Int. Cl.[7] .................................. H01L 21/31
(52) U.S. Cl. .............. 438/788; 438/626; 438/629; 438/645; 438/652; 438/672; 438/675
(58) Field of Search ...................... 438/626, 629, 438/645, 652, 672, 675, 788

(56) References Cited

U.S. PATENT DOCUMENTS 6,159,835 * 12/2000 Visokay et al. .................. 438/592

* cited by examiner

Primary Examiner—John F. Niebling
Assistant Examiner—David A Zarneke

(57) ABSTRACT

A method for forming oxide layer on conductor plug of trench structure is proposed. The invention includes following essential steps: First, provide a substrate where a trench locates inside the substrate, herein the trench is partly filled by a conductor plug. Second, forms a plasma enhanced tetraethyl-orthosilicate layer on the substrate, herein the plasma enhanced tetraethyl-orthosilicate layer also fills the trench and covers the conductor plug. Finally, removes the plasma enhanced tetraethyl-orthosilicate layer until the substrate is not covered by the plasma enhanced tetraethyl-orthosilicate layer, herein the conductor plug still is covered by the plasma enhanced tetraethyl-orthosilicate layer. Additional, advantages of application of plasma enhanced tetraethyl-orthosilicate layer comprise compacted structure and high deposit rate.

22 Claims, 4 Drawing Sheets

METHOD FOR FORMING OXIDE LAYER ON CONDUCTOR PLUG OF TRENCH STRUCTURE

BACKGROUND OF THE INVENTION

1. Field of the Invention

The present invention relates cover of conductor plug that inside trench, and more particularly relates to a method for providing required cover without disadvantages such as porous structure and wastage of conductor plug.

2. Description of the Prior Art

In contemporary semiconductor devices, trench usually is formed in substrate and is used to form shallow isolation by filling dielectric material into trench. However, in some semiconductor devices, such as power integrated circuits, materials filled into trench comprise conductor. Refers to FIG. 1A that briefly illustrates conventional trench structure with conductor plug, wherein conductor plug 11 is located inside trench that is inside substrate 10 and is covered by dielectric plug 12. Moreover, an optional dielectric plug may exist at bottom part of trench and be located under conductor plug 11. It should be noted that substrate 10 can further comprise some structures, such as transistors and conductor lines, in and on it.

Conventional method for covering conductor plug 11 by conductor plug comprises following steps: forms a low O3 flow rate tetraethyl-orthosilicate (TEOS) layer on substrate and fills empty part of the trench; then forms a high O3 flow rate flow rate tetraethyl-orthosilicate layer on the low O3 flow rate TEOS layer; and then etch back these TEOS layers until substrate is not covered by these layers but conductor plug still is covered. Herein, low O3 flow rate TEOS layer is used as a buffer layer and high O3 flow rate flow TEOS layer is used to provide a smoother surface. Moreover, deposit rate of these layers is about 1500 angstroms per minutes and the method can further comprises an anneal process before etch back these layers. However, as FIG. 1B shows, an unavoidable defect of the method is the porous structure of $O_3$/TEOS layer 14, especially as is treated by an etch back process, the porous surface will induces some disadvantages in following process.

Beside, when conductor plug 11 is a polysilicon plug, another conventional method for forming dielectric plug 12 is that directly oxidates the polysilicon plug to form oxide plug 15 on conductor plug 11, as shown in FIG. 1C. Advantages of the method include simply process and smooth surface of dielectric plug (oxide plug). However, unavoidable defects include exhaust of polysilicon plug for part of polysilicon plug is depleted during the oxidation process. Further, because the trench structure is part of a semiconductor device, sometime the depleted polysilicon plug is improper and sometime even dielectric plug can not be oxide plug 15.

Accordingly, it is obvious that conventional methods for forming dielectric layer on conductor plug of trench structure are defective and then a mendable method is required, especially when importance of power integrated circuits is increased.

SUMMARY OF THE INVENTION

The primary object of the invention is to propose a method that forms oxide layer on conductor plug of trench structure.

Another object of the invention is to modify conventional trench structure that comprises conductor plug, and particularly to improve conventional disadvantages of dielectric layer such as low deposit rate, porous structure and depleted conductor plug.

A further object of the invention is to present a practical and manufacturable method for covering conductor plug of trench structure.

In order to achieve previous objects of the invention, a method comprises following essential steps are present as a preferred embodiment: First, provide a substrate where a trench locates inside the substrate, herein the trench is partly filled by a conductor plug. Second, forms a plasma enhanced tetraethyl-orthosilicate layer on the substrate, herein the plasma enhanced tetraethyl-orthosilicate layer also fills the trench and covers the conductor plug. Finally, removes the plasma enhanced tetraethyl-orthosilicate layer until the substrate is not covered by the plasma enhanced tetraethyl-orthosilicate layer, herein the conductor plug still is covered by the plasma enhanced tetraethyl-orthosilicate layer.

Another embodiment is a method for covering polysilicon plug inside trench by dielectric layer. First, provides a substrate that comprises a trench. Then, forms a polysilicon plug inside the trench. And then, forms a plasma enhanced tetraethyl-orthosilicate layer on the substrate, herein the plasma enhanced tetraethyl-orthosilicate layer also fills the trench and covers the polysilicon plug.

Obviously, main spirit of the invention is to cover the conductor plug by plasma enhanced tetraethyl-orthosilicate layer that structure is compacted and deposit rate is high, and then some disadvantages of well-known technology are overcame.

BRIEF DESCRIPTION OF THE DRAWINGS

The foregoing aspects and many of the accompanying advantages of this invention will become more readily appreciated as the same becomes better understood by reference to the following detailed description, when taken in conjunction with the accompanying drawings, wherein.

DESCRIPTION OF THE PREFERRED EMBODIMENT

Figure 1A:
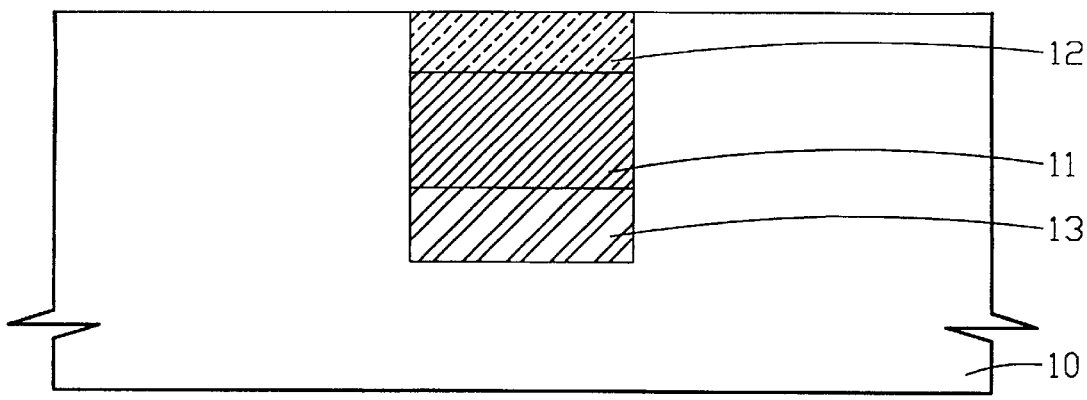
FIG. 1A to FIG. 1C are some brief qualitative figures about structure of trench structure and defects of some conventional methods for forming dielectric plug on conductor plug.
Figure 1B:
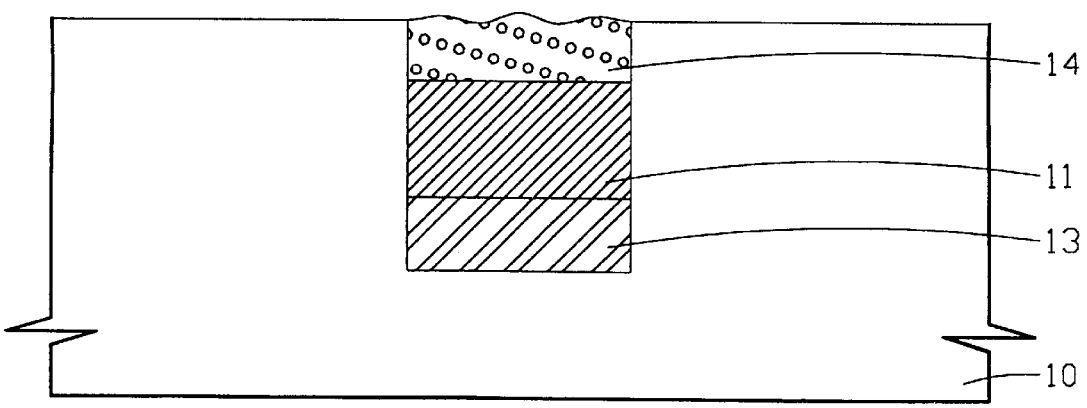
Figure 1C:
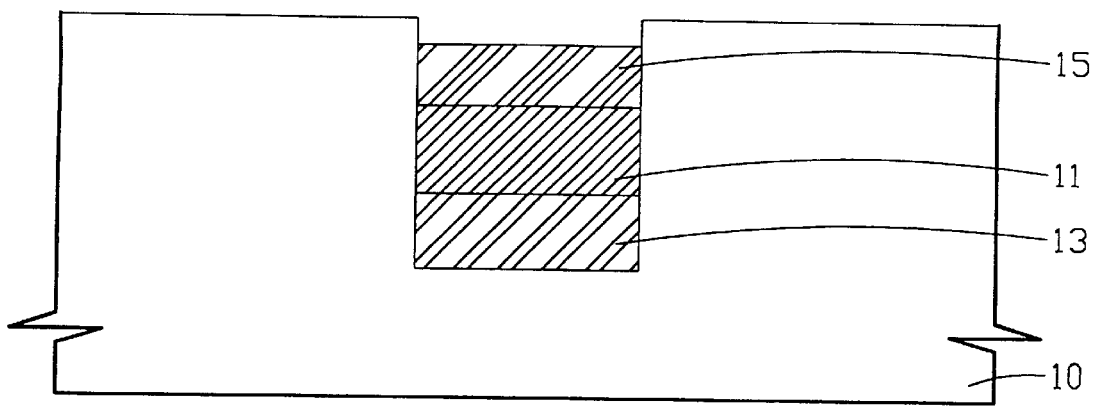
Figure 2A:
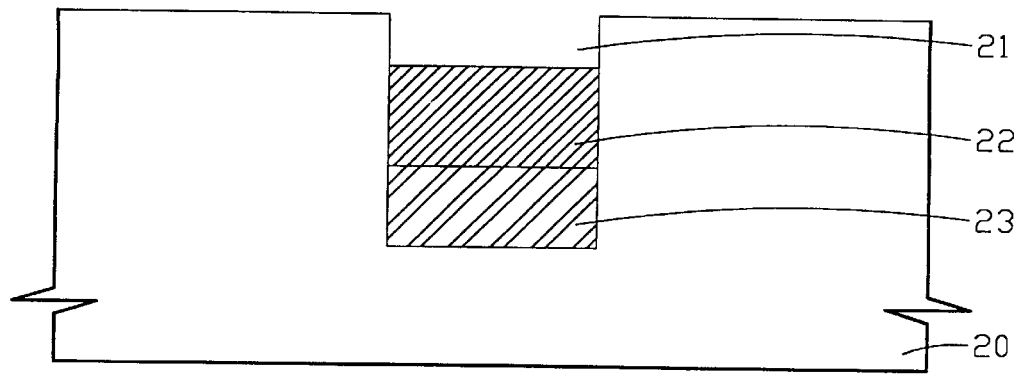
FIG. 2A to FIG. 2C are a series of brief qualitative figures about different steps of one preferred embodiment of the proposed invention.

First preferred embodiment is a method for forming oxide layer on conductor plug of trench structure. Refers to following figures, the method comprises following steps:

First, as FIG. 2A show, provides substrate 20 where trench 21 locates inside. Herein trench 21 is partly filled by conductor plug 22 and available varieties of conductor plug 22 comprise metal plug and polysilicon plug. Further, the method further comprises forming dielectric plug 23 that locates at bottom part of trench 21 and under conductor plug 22.

Figure 2B:
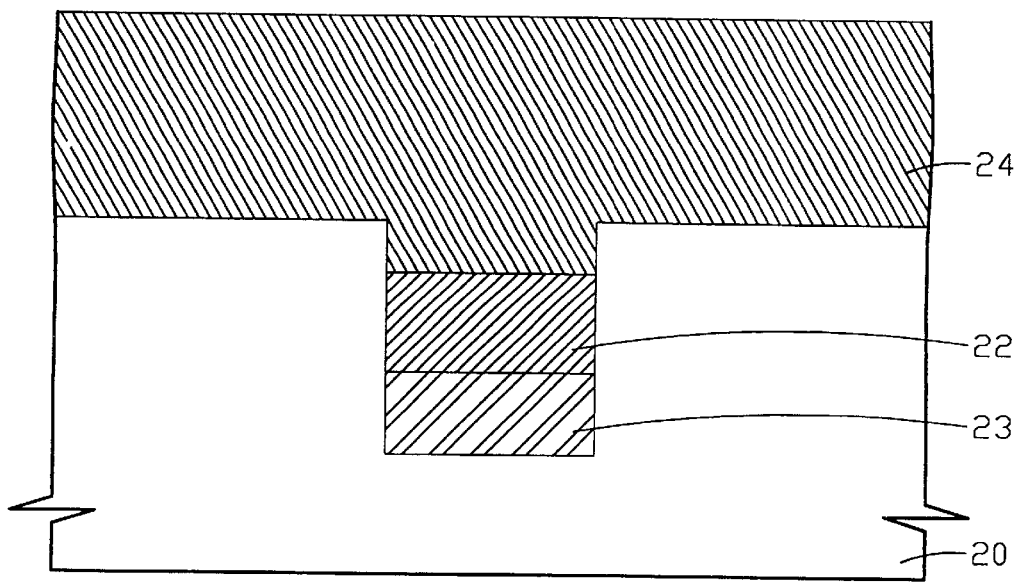

Then, as shown in FIG. 2B, forms plasma enhanced tetraethyl-orthosilicate layer 24 on substrate 20. Where plasma enhanced tetraethyl-orthosilicate layer 24 also fills trench 21 and covers conductor plug 22. In other words, the present method covers conductor plug 22 by oxide. Further, thickness of plasma enhanced tetraethyl-orthosilicate layer 24 is about 10000 angstroms.

In the present method, pressure for forming plasma enhanced tetraethyl-orthosilicate layer 24 is about 7.5–8.2 torrs; temperature for forming plasma enhanced tetraethyl-orthosilicate layer 24 is about 350° C. to 350° C.; power of the radio frequency source for forming plasma enhanced tetraethyl-orthosilicate layer 24 is about 800–880 watts and frequency of the radio frequency source for forming plasma enhanced tetraethyl-orthosilicate layer 24 is about 13.56 MHz. Beside, deposit rate of plasma enhanced tetraethyl-orthosilicate layer 24 is about 7000 angstroms per minutes.

Figure 2C:
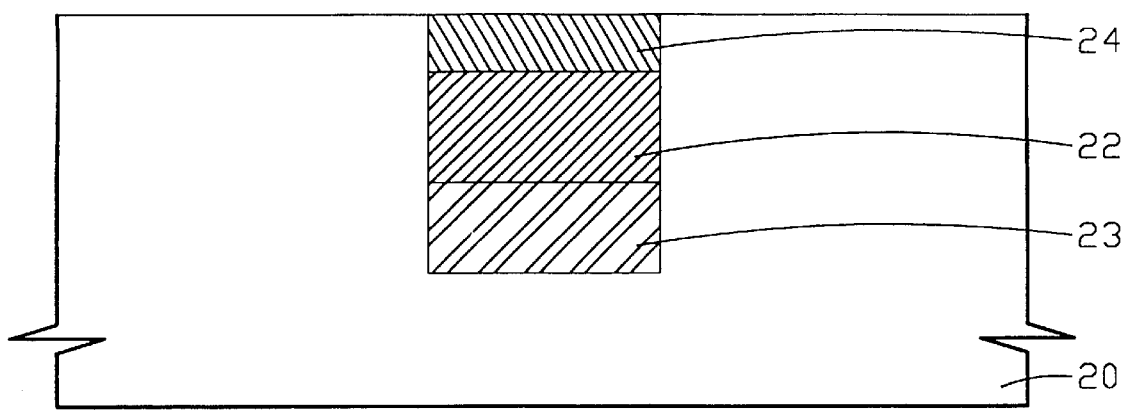

Next, as FIG. 2C shows, removes plasma enhanced tetraethyl-orthosilicate layer 24 until substrate 20 is not covered by plasma enhanced tetraethyl-orthosilicate layer 24. Herein conductor plug 22 still is covered by plasma enhanced tetraethyl-orthosilicate layer 24 and methods for removing plasma enhanced tetraethyl-orthosilicate layer 24 comprises an etch back process.

Furthermore, in order to further improve quality of plasma enhanced tetraethyl-orthosilicate layer 24, the present method further comprises annealing plasma enhanced tetraethyl-orthosilicate layer 24 before plasma enhanced tetraethyl-orthosilicate layer 24 is removed. On the other hand, in order to minimizes the risk that plasma enhanced tetraethyl-orthosilicate layer 24 is damaged by any supervenient charges of process, the present method also further comprising a discharging process that is used to discharge any charge inside plasma enhanced tetraethyl-orthosilicate layer 24.

Obviously, because conductor plug 22 is not consumed during formation of plasma enhanced tetraethyl-orthosilicate layer 24, one conventional disadvantage that depleted conductor plug 22 is prevented. Beside, because structure of plasma enhanced tetraethyl-orthosilicate layer 24 is more compact than both high O3 flow rate tetraethyl-orthosilicate and low O3 flow rate tetraethyl-orthosilicate, especially after the etch back process is performed, conventional disadvantage of porous structure also is effectively improved.

In short, the present method effectively improves disadvantages of conventional method for forming dielectric layer on conductor plug. That is to say, whenever dielectric plug can be provided by oxide plug, the proposed invention is better than conventional methods.

Beside, because deposit rate of plasma enhanced tetraethyl-orthosilicate layer 24 is larger than deposit rate of $O_3$ tetraethyl-orthosilicate, the former is about 7000 angstroms per minutes and the later is about 1500 angstroms per minutes, efficiency of the present method is significant for practical mass production.

Of course, it is to be understood that the invention need not be limited to these disclosed embodiments. Various modification and similar changes are still possible within the spirit of this invention. In this way, the scope of this invention should be defined by the appended claims.

What is claimed is:

1. A method for forming oxide layer on conductor plug of trench structure, comprising
   providing a substrate where a trench locates inside said substrate, herein said trench is partly filled by a conductor plug;
   forming a plasma enhanced tetraethyl-orthosilicate layer on said substrate, herein said plasma enhanced tetraethyl-orthosilicate layer also fills said trench and covers said conductor plug; and
   removing said plasma enhanced tetraethyl-orthosilicate layer until said substrate is not covered by said plasma enhanced tetraethyl-orthosilicate layer, herein said conductor plug still is covered by said plasma enhanced tetraethyl-orthosilicate layer.

2. The method according to claim 1, wherein said conductor plug comprises polysilicon plug.

3. The method according to claim 1, wherein said conductor plug comprises metal plug.

4. The method according to claim 1, further comprising forming a dielectric plug at the bottom part of said trench and under said conductor plug.

5. The method according to claim 4, wherein said dielectric plug is an oxide plug.

6. The method according to claim 1, wherein pressure for forming said plasma enhanced tetraethyl-orthosilicate layer is about 7.5 torrs to 8.5 torrs.

7. The method according to claim 1, wherein temperature for forming said plasma enhanced tetraethyl-orthosilicate layer is about 350° C. to 450° C.

8. The method according to claim 1, wherein power of the radio frequency source for forming said plasma enhanced tetraethyl-orthosilicate layer is about 800 watts to 880 watts.

9. The method according to claim 1, wherein frequency of the radio frequency source for forming said plasma enhanced tetraethyl-orthosilicate layer is about 13.56 MHz.

10. The method according to claim 1, wherein thickness of said plasma enhanced tetraethyl-orthosilicate layer is about 10000 angstroms.

11. The method according to claim 1, wherein deposit rate of said plasma enhanced tetraethyl-orthosilicate layer is about 7000 angstroms per minutes.

12. The method according to claim 1, wherein methods for removing said plasma enhanced tetraethyl-orthosilicate layer comprises an etch back process.

13. The method according to claim 1, further comprising annealing said plasma enhanced tetraethyl-orthosilicate layer before said plasma enhanced tetraethyl-orthosilicate layer is removed.

14. The method according to claim 1, further comprising a discharging process that is used to discharge any charge inside said plasma enhanced tetraethyl-orthosilicate layer.

15. A method for covering polysilicon plug inside trench by dielectric layer, comprising:
   providing a substrate which comprises a trench;
   forming a polysilicon plug inside said trench; and
   forming a plasma enhanced tetraethyl-orthosilicate layer on said substrate, herein said plasma enhanced tetraethyl-orthosilicate layer also fills said trench and covers said polysilicon plug.

16. The method according to claim 15, further comprising forming a dielectric plug at bottom part of said trench before said polysilicon plug is formed.

17. The method according to claim 15, wherein pressure for forming said plasma enhanced tetraethyl-orthosilicate layer is about 7.5 torrs to 8.5 torrs.

18. The method according to claim 15, wherein temperature for forming said plasma enhanced tetraethyl-orthosilicate layer is about 350° C. to 450° C.

19. The method according to claim 15, wherein power of the radio frequency source for forming said plasma enhanced tetraethyl-orthosilicate layer is about 800 watts to 880 watts.

20. The method according to claim 15, wherein frequency of the radio frequency source for forming said plasma enhanced tetraethyl-orthosilicate layer is about 13.56 MHz.

21. The method according to claim 15, further comprising annealing said plasma enhanced tetraethyl-orthosilicate layer after said plasma enhanced tetraethyl-orthosilicate layer is formed.

22. The method according to claim 15, further comprising a discharging process that is used to discharge any charge inside said plasma enhanced tetraethyl-orthosilicate layer.

* * * * *